(12) United States Patent
Endres et al.

(10) Patent No.: US 10,146,136 B2
(45) Date of Patent: Dec. 4, 2018

(54) REFLECTING COATING WITH OPTIMIZED THICKNESS (71) Applicant: Carl Zeiss SMT GmbH, Oberkochen (DE)

(72) Inventors: Martin Endres, Koenigsbronn (DE); Hartmut Enkisch, Aalen (DE); Stig Bieling, Aalen (DE)

(73) Assignee: CARL ZEISS SMT GMBH, Oberkochen (DE)

( * ) Notice: Subject to any disclaimer, the term of this patent is extended or adjusted under 35 U.S.C. 154(b) by 10 days.

(21) Appl. No.: 14/839,404

(22) Filed: Aug. 28, 2015

(65) Prior Publication Data
US 2016/0048083 A1 Feb. 18, 2016

Related U.S. Application Data (63) Continuation of application No. PCT/EP2014/053725, filed on Feb. 26, 2014.
(Continued)

(30) Foreign Application Priority Data

Feb. 28, 2013 (DE) ........................ 10 2013 203 364

(51) Int. Cl.
*G03B 27/54* (2006.01)
*G03B 27/42* (2006.01)
(Continued)

(52) U.S. Cl.
CPC ........... *G03F 7/702* (2013.01); *G02B 5/0875* (2013.01); *G02B 5/0891* (2013.01);
(Continued)

(58) Field of Classification Search
CPC .. G03F 7/702; G03F 7/70075; G03F 7/70316; G03F 7/70958; G03F 7/70091;
(Continued)

(56) References Cited

U.S. PATENT DOCUMENTS

| 6,658,084 B2 | 12/2003 | Singer |
| 2003/0099034 A1 | 5/2003 | Mann |

(Continued)

FOREIGN PATENT DOCUMENTS

| DE | 102009054888 A1 | 6/2011 |
| JP | 2003177319 A | 6/2003 |

(Continued)

OTHER PUBLICATIONS

International Search Report and Written Opinion in counterpart International Application No. PCT/EP2014/053725, dated Jul. 7, 2014.

(Continued)

*Primary Examiner* — Mesfin Asfaw
(74) *Attorney, Agent, or Firm* — Edell, Shapiro & Finnan, LLC (57) ABSTRACT

An illumination system for an optical arrangement such as an EUV lithography apparatus, having: at least one optical element which has at least one optical surface, on which a coating which reflects illumination radiation is applied, and an actuator device aligning the optical surface in at least two angular positions in the radiation path. The coating either has a thickness ($d_{OPT1}$) at which a mean value ($\frac{1}{2}(R_1+R_2)$) formed from a thickness-dependent reflectivity ($R_1$, $R_2$) of the coating at the at least two angular positions is maximized or has a thickness ($d_{OPT2}$) at which a maximum change ($\max(\Delta R_1/R_1, \Delta R_2/R_2)$) in the reflectivity ($R_1$, $R_2$) caused by a thickness tolerance of the coating is minimized at the respective angular positions or else the reflecting coating has (Continued)

a thickness ($d_{O2}$) at which the reflectivity ($R_1$, $R_2$) of the coating has the same magnitude in the at least two angular positions.

19 Claims, 3 Drawing Sheets

Related U.S. Application Data (60) Provisional application No. 61/770,495, filed on Feb. 28, 2013.

(51) Int. Cl.
*G03F 7/20* (2006.01)
*G21K 1/06* (2006.01)
*G02B 17/08* (2006.01)
*G02B 5/08* (2006.01)

(52) U.S. Cl.
CPC ..... *G02B 17/0848* (2013.01); *G03F 7/70075* (2013.01); *G03F 7/70116* (2013.01); *G03F 7/70316* (2013.01); *G03F 7/70958* (2013.01); *G21K 1/062* (2013.01)

(58) Field of Classification Search
CPC ............... G03F 7/7015; G03F 7/70825; G03F 7/70058; G03F 7/70141; G03F 7/70083; G02B 5/09; G02B 5/0891; G02B 26/0833; G02B 5/0816; G02B 19/0023; G02B 26/0816; G02B 3/0006
See application file for complete search history.

(56) References Cited

U.S. PATENT DOCUMENTS

| | | |
|---|---|---|
| 2006/0192147 A1 | 8/2006 | Kandaka et al. |
| 2009/0041182 A1 | 2/2009 | Endres et al. |
| 2011/0228244 A1 | 9/2011 | Mann |
| 2012/0044474 A1 | 2/2012 | Hauf et al. |
| 2012/0293785 A1 | 11/2012 | Kirch et al. |

FOREIGN PATENT DOCUMENTS

| | | |
|---|---|---|
| JP | 2010199503 A | 9/2010 |
| JP | 2011228698 A | 11/2011 |
| JP | 2012506135 A | 3/2012 |
| JP | 2013514639 A1 | 4/2013 |
| WO | 2005038886 A1 | 4/2005 |

OTHER PUBLICATIONS

Office Action in corresponding German Application No. 102013203364.8, dated Oct. 31, 2013, along with an English translation.
Office Action in corresponding Japanese Application 2015559490, dated Feb. 6, 2018, along with English Translation.

REFLECTING COATING WITH OPTIMIZED THICKNESS

CROSS-REFERENCE TO RELATED APPLICATIONS

This application is a Continuation of International Application No. PCT/EP2014/053725, filed on Feb. 26, 2014, which claims benefit under 35 U.S.C. § 119(e) to U.S. Provisional Application No. 61/770,495, filed Feb. 28, 2013, and which claims priority under 35 U.S.C. § 119(a) to German Patent Application No. 10 2013 203 364.8, also filed on Feb. 28, 2013. The disclosures of all three related applications are considered part of and are incorporated by reference into the disclosure of the present application in their respective entireties.

FIELD AND BACKGROUND OF THE INVENTION

The invention relates to an illumination system for an optical arrangement, in particular for an extreme-ultraviolet (EUV) lithography apparatus, comprising: at least one optical element, which has at least one optical surface, preferably a plurality of optical surfaces, on which a coating which reflects the illumination radiation from a light source is applied, and an actuator device for aligning the at least one optical surface in at least two angular positions. The invention also relates to an optical arrangement, in particular an EUV lithography apparatus, with such an illumination system, a method for optimizing the thickness of a reflecting coating of an optical surface of such an optical element, and a method for applying a coating with an optimized thickness.

Microlithographic reflecting optical elements (mirrors), especially for EUV lithography, have a reflecting coating, the layer design of which has to be matched very precisely to the expected operating wavelength and to the expected angles of incidence of the light striking the mirrors in order to ensure acceptable reflectivity, because such mirrors only have a reflectivity of typically less than approximately 70%, even in the ideal case.

The angle of incidence or the angle of incidence distribution of the radiation on an optical surface depends on the alignment of the optical surface in the beam path (relative to the light source). In illumination systems of projection exposure apparatuses, use is often made of optical elements in the form of facet mirrors, which have a plurality of facet elements, the optical surfaces of which can be aligned at different angular positions relative to the incident beam path. In so doing, it is typically possible to select between a plurality of switch positions (at least two), in which the radiation is incident at two (or more) different angles or (narrow) angle distributions. Here, a layer thickness of the reflecting coating that is optimal for the respective alignment or switch position and at which the reflectivity is maximized, generally is not optimal for a different angular position. Moreover, the production of layers or of coatings for EUV mirrors is complicated, so that the layer thickness obtained in the manufacturing process does not correspond exactly to the desired, intended layer thickness, due to manufacturing variances.

SUMMARY

It is an object of the invention to provide an illumination system, an optical arrangement, in particular an EUV lithography apparatus, a method for optimizing the thickness of a reflecting coating and a method for applying a reflecting coating, in which the influence of manufacturing errors on the reflectivity is as small as possible.

This object is achieved by an illumination system of the type mentioned in the introduction, in which the reflecting coating either has a thickness at which a mean value formed from a thickness-dependent reflectivity of the coating at the at least two angular positions is maximized or in which the coating has a thickness at which a maximum change in the reflectivity caused by a thickness tolerance of the coating is minimized at the respective angular positions or else in which the reflecting coating has a thickness at which the reflectivity of the coating has the same magnitude in the at least two angular positions.

In the case of optical surfaces, which are operated in at least two (e.g. discrete) switch or angular positions, in which there is a different dependence of the reflectivity on the coating thickness due to a different angle of incidence or a different angle of incidence distribution of the incident illumination radiation, it is generally necessary to find a compromise for the thickness of the reflecting coating to be employed, which compromise ensures acceptable reflectivity at all angular positions. A criterion for the selection of a suitable thickness of the reflecting coating lies in the independence, which is as complete as possible, of the reflectivity in relation to manufacturing-dependent changes in thickness or variations in thickness. It should be noted here that even small variations in thickness in the sub-nanometer region may already lead to significant changes in the reflectivity.

The reflecting coating is typically a multilayer coating, which achieves the reflecting effect by interference effects. Within the meaning of this application, the thickness of the reflecting coating to be optimized is not understood to mean the overall thickness of the layer stack, which is applied onto a substrate in order to achieve the reflecting effect, but rather the thickness formed by a number N of subunits, which are arranged in a periodic or virtually periodic sequence and which each have a first layer made of a material with a high refractive index and a second layer made of a material with a low refractive index. For simplicity, the assumption is made that the thickness of the reflective coating is given by $d = N*d_U$, where $d_U$ denotes the thickness of a respective subunit. The thickness $d_U$ of the subunit or the thickness $d$ of the reflecting coating does not take into account functional layers which may be present in the coating and e.g. act as diffusion barriers.

In order to generate a high reflectivity, the subunits or the thicknesses $d_U$ thereof must be dimensioned in such a way that the reflections occurring at the different subunits are superposed constructively with the same phase. Since there is a reliance on this interference effect, the layer thickness or the sum of the thicknesses of the individual layers of a respective subunit must be matched as precisely as possible to the angle of incidence to be expected (or the angle of incidence distribution to be expected) and the wavelength (or the wavelength distribution to be expected) of the illumination radiation in order to satisfy the Bragg condition. The reflectivity of the coating cannot be increased arbitrarily by increasing the number N of subunits (layer pairs), i.e. the reflectivity reaches a limit at a value of approximately 60% or approximately 70%. The number N of subunits generally is selected in this case in such a way that it is no longer possible to increase the reflectivity by adding further subunits. In order to optimize the reflectivity, the thickness $d_U$ of a respective subunit or else the overall thickness $d = N*d_U$ of the coating of a respective reflecting surface can be selected in a suitable manner. All that is relevant to the above-described selection of the thickness of the reflecting coating is that the thickness-dependent reflectivity is known at the at least two angular positions and the same value ($d_U$ or $N*d_U$) is assumed.

By contrast, the overall thickness of the layer stack is dependent on further conditions (costs, roughnesses, . . . ) or on whether a layer stack with the respective overall thickness is still useful (from a certain thickness of the coating, absorption effects are so great that the incident illumination radiation can no longer emerge). The overall thickness of the coating is also selected to be so large that it is sufficient for the service life of the optical element should the environment of the coating be so aggressive that the layers of the coating are ablated over time (e.g. by sputtering or the like).

In so doing, the layer thickness of the reflecting coating, in accordance with the first criterion specified above, can be selected in such a way that the reflectivity curve averaged over the respective angles of incidence (in the corresponding angular positions) is optimized, i.e. an optimum for the functional $<R(d, AOI)>_{AOI}$ is sought after, wherein d denotes the thickness and AOI ("angle of incidence") denotes the angle of incidence spectrum, which typically has a discontinuous profile in the case of discrete tilt angle positions of the optical surfaces. The functional $<R(d, AOI)>_{AOI}$ denotes the arithmetic mean of the reflectivity at the individual switch or angular positions. The arithmetic mean typically constitutes a suitable measure for the optimization if the two or more angular or switch positions have the same importance or are used with the same frequency.

In one embodiment, the mean value formed from the thickness-dependent reflectivity is a mean value weighted over the at least two angular positions, with the weighting of the angular positions being dependent on the position of the optical surface on the optical element. Depending on the position of the optical surface or facet of a facet element in the illumination beam path, one of the switch positions may possibly be used more frequently for forming the illumination pupil than other switch positions. It may therefore be advantageous for the optical surface or facet to have an increased reflectivity in this switch position compared to the other switch positions, which can be taken into account by a higher weight when determining the mean value. Moreover, the effect of a change in the reflectivity of a respective facet or optical surface on errors in the exposure process is possibly different in the respective switch positions, such that a change in the reflectivity may possibly be more likely to be accepted in a specific switch position than in other switch positions, which can likewise be taken into account by an appropriate weighting when determining the mean value.

All these factors depending on the position of the respective facet or optical surface and the respective switch position can be taken into account by the weighted mean value, i.e. a (facet-dependent) weighting function f(AOI) is introduced when forming the functional, so that the following applies to the functional: $<f(AOI)*R(d, AOI)>_{AOI}$. By way of example, the weighting function f(AOI) can take into account for how long the optical surface is expected to be operated in the respective switch or angular position during the operation of the illumination system. This depends e.g. on how long the illumination system is operated in a respective illumination mode (relative to the operating duration in the other illumination modes). Additionally, or as an alternative thereto, switch positions, in which a change in the reflectivity has a comparatively small effect on the overall system, can be evaluated with a smaller weight than switch positions in which the change in the reflectivity has relatively large effects on the errors in the exposure process.

Finding the optimum of the thickness in this case corresponds to finding that thickness $d_{OPT1}$ in which the derivative of the corresponding functional with respect to the thickness d has a zero. If this derivative is determined for exactly two angular positions in the case of the same weighting (i.e. as an arithmetic mean), the derivatives with respect to the thickness d at the optimum thickness $d_{OPT1}$ have the same magnitude in the two switch positions, but an opposite sign. In this case, the sensitivity of the reflectivity in respect of manufacturing-dependent layer thickness variations, i.e. deviations from the optimum thickness $d_{OPT1}$, is therefore the same for both angular positions.

If the (maximum) layer thickness variations or layer thickness tolerances occurring due to the manufacturing process are already known when producing the coating, the thickness of the coating can be selected in such a way that the changes in the reflectivity caused by the predetermined tolerances have as little effect as possible at all angular positions. In order to achieve this, that layer thickness can be selected as optimum layer thickness $d_{OPT2}$ at which the greatest or maximum (relative) change in the reflectivity is as small as possible or minimal.

A further option for reducing the influence of manufacturing errors on the reflectivity consists of selecting a thickness for the coating at which the reflectivities have the same magnitude in the at least two angular positions. This manner of setting the thickness is particularly simple and likewise leads to a significant reduction in the sensitivity of the reflectivity of the thickness tolerance.

It is understood that the three criteria specified above generally lead to different optimum layer thicknesses. If the (maximum) manufacturing tolerances are known prior to applying a coating, it is generally more advantageous to use the second criterion. However, compared to other options for setting the layer thickness (e.g. by maximizing the reflectivity for an angle of incidence averaged over the angular positions), a significant reduction in the sensitivity in relation to manufacturing variances can be achieved in all three cases.

In one embodiment, a difference angle between in each case two of the (generally discrete) (tilt) angle positions is at least 1°, preferably at least 2°, in particular at least 3°. In order to be able to set the illumination of the subsequent optical system (in the case of a honeycomb condenser e.g. the pupil facet mirror) as flexibly as possible, a variation of the angular positions or of the tilt angles that is as large as possible is desired. Although a large change in the angle of incidence is undesirable when switching between the at least two different angular positions, this typically cannot be avoided, or can only be avoided with great difficulties, for at least some of the optical surfaces of the optical element. The optimization can be undertaken for a plurality of (discrete) tilt angle positions, which may be significantly separated (i.e. by at least 1°) from one another.

The optical surfaces can be moved between the different angular positions with an actuator device. By way of example, the actuator device can be embodied in the form of a piezo-actuator in order to bring about tilting of the optical surface. However, the different angular positions can also be set by rotating a respective facet element about an axis of rotation, for example in the manner described in DE 10 2009 054 888 A1. It is understood that the actuator device generally enables a continuous rotation or tilting of the optical surfaces. However, in the case of a (field) facet mirror in particular, only specific, discrete angular positions are typically employed, which are set by the actuator device and for which the reflectivity has to be optimized. In general, no such optimization is required for the intermediate values lying between these angular positions.

In general, a discrete angle of incidence can be assigned to a discrete tilt angle position since the angle of incidence distribution about the discrete angle of incidence is very narrow compared to the difference between the (discrete) angles of incidence at the different switch positions. In this case, the above-described functional $<f(AOI)*R(d, AOI)>_{AOI}$ becomes a sum over the thickness-dependent reflectivities at the different tilt angle positions, to which exactly one angle of incidence is assigned in each case. However, it is understood that the functional $<f(AOI)*R(d, AOI)>_{AOI}$ need not necessarily be available in the form of a sum, but in general constitutes an integral in which the weighting function f(AOI) optionally vanishes in sections (i.e. for specific angle of incidence ranges). In the above-described case, the weighting function f(AOI) can be represented as a sum of delta functions (optionally each with a weighting factor), which corresponds to the discrete case (formation of sums).

In a further embodiment, the thickness of the reflecting coating varies depending on the position on the optical surface, to be precise typically depending on the respective (spatially dependent) angle of incidence or on the respective (spatially dependent) angle of incidence spectrum. In this case, a discrete angle of incidence is not assigned to an angular or tilt position, but rather the thickness of the reflecting coating is optimized depending on the position on the optical surface, as a result of which typically a thickness of the coating which varies depending on the position is set.

In a further embodiment, the illumination system has a light source that generates illumination radiation, the wavelength spectrum of which has a maximum intensity at an operating wavelength of the illumination system. The reflectivity of the coating in a respective angular position typically is optimized for a discrete angle of incidence, but optionally there can also be an optimization over a (narrow) angle of incidence distribution at the respective angular position (see above). The reflectivity of the coating additionally depends on the wavelength of the illumination radiation incident on the optical surface. In the simplest case, the reflectivity at the individual angular positions can be determined for the operating wavelength, at which the intensity of the illumination radiation is at a maximum.

In a further embodiment, the optical element is embodied as a facet mirror and the optical surfaces are formed on facet elements of the facet mirror. In illumination systems, facet mirrors are often employed for setting different illumination settings for generating different illumination pupils (angular distributions) of the illumination system, e.g. dipole illumination, etc., the facet elements of which facet mirrors can be switched between different angular positions. Typically, use is in this case made of two facet mirrors, in which, by switching between the switch states of the facet elements of the first facet mirror in the beam path, it is possible to vary the assignment to the facet elements of the facet mirror downstream in the beam path depending on the desired illumination setting.

A further aspect relates to an optical arrangement, in particular an EUV lithography apparatus for exposing a substrate, comprising: an illumination system, which is embodied as described above. The illumination system serves to illuminate a predetermined illumination field, on which a mask ("reticle") is arranged, which is imaged with a reduced scale on a light-sensitive substrate by a downstream projection lens.

In one embodiment, averaging is carried out at the at least two angular positions over the wavelength spectrum which is generated by the light source and which is filtered by the further optical elements of the optical arrangement for determining the thickness-dependent reflectivity of the reflecting coating of the optical element or of the optical surface. In an optical arrangement, e.g. in the form of an EUV lithography apparatus, there are a plurality of optical elements (mirrors), which each act like a spectral filter for the incident illumination radiation. The originally comparatively broad spectrum of the light source therefore becomes narrower from reflection to reflection on a respective optical element. Typically, the wavelength distribution emerging from the optical arrangement, i.e. the spectral distribution arriving at the light-sensitive substrate or the wafer in the case of an EUV lithography apparatus, is important for optimizing the layer thickness. Therefore, in order to optimize the layer thickness of a respective optical element, both the distribution of the radiation spectrum of the light source and the spectral filter effect of the other optical elements (upstream and downstream in the beam path of the optical element to be optimized) should be taken into account.

A further aspect of the invention is implemented in a method for optimizing a thickness of a reflecting layer of an optical surface of an optical element for an illumination system of an optical arrangement, in particular for an illumination system of an EUV lithography apparatus, comprising: determining a thickness-dependent reflectivity of the coating in at least two angular positions, in which the optical surface can be aligned in the illumination beam path of a light source, and either determining a thickness for the coating at which a mean value formed from the thickness-dependent reflectivity at the at least two angular positions is maximized or determining a thickness for the coating at which the maximum change in the thickness-dependent reflectivity caused by a thickness tolerance of the coating is minimized at the respective angular positions or else determining a thickness for the coating at which the reflectivity has the same magnitude in the at least two angular positions.

The method is typically applied before a subsequent coating procedure, during which the coating is applied onto a substrate or onto an optical surface. In order to carry out the second alternative of the method, it is necessary for the thickness tolerance occurring during the production process to be known or to be able to be estimated.

In one variant of the method, a weighting over the at least two angular positions is made for forming the mean value, with the weighting of the angular positions being dependent on the position of the optical surface to be optimized in each case (or on the respective mirror facet) on the optical element. As was explained further above, e.g. the (expected) proportion of the operation duration of the optical surface in the respective switch position and/or the influence of a change in the reflectivity in the respective switch position on the errors during the exposure process can be taken into account for the weighting.

In one variant, a difference angle between in each case two of the angular positions is at least 1°, preferably at least 2°, in particular at least 3°. Typically, the above-described method is applied by virtue of a thickness-dependent reflectivity curve being determined or calculated (simulated) for a plurality of discrete angular positions. The corresponding angles of incidence of the illumination radiation at the respective angular positions should deviate as little as possible from one another, but this generally cannot be realized for all mirror facets due to the requirements of the illumination system, e.g. in view of the installation space. The above-described layer thickness optimization becomes ever more important, the larger the angles of incidence become or the larger the difference between the angles of incidence becomes at the different angular positions.

In one variant, the thickness of the reflecting coating is determined depending on the position on the optical surface. In this case, the reflectivity of the reflecting coating is optimized individually by a suitable selection of the thickness for each point of the optical surface, wherein the angle of incidence spectrum present at the respective position is taken into account for the optimization. This typically results in a reflecting coating with a thickness that varies over the reflecting surface depending on the position.

In a further variant, the thickness-dependent reflectivity of the reflecting coating of the at least one optical surface of the optical element at the at least two angular positions is averaged over the wavelength spectrum which is generated by the light source and which is filtered by the further optical elements of the optical arrangement. By averaging over the wavelength-dependent intensity distribution which emerges from the optical arrangement and e.g. arrives at the wafer in the case of an EUV lithography apparatus, it is possible to increase the accuracy of the layer thickness optimization.

A final aspect of the invention relates to a method for generating a reflecting coating on an optical surface of an optical element for an illumination system of an optical arrangement, in particular for an illumination system of an EUV lithography apparatus, comprising: applying the coating on the optical surface with a thickness determined as per the above-described method. The coating can be applied in various ways, with typically there being a deposition of a respective layer material from the gaseous phase, e.g. by CVD ("chemical vapor deposition") or by PVD ("physical vapor deposition"). Here, the coating generally has a plurality of layer pairs with alternating refractive indices, the layer thicknesses of which are matched to the operating wavelength or to the wavelength-dependent intensity distribution and to the angle of incidence or the angle of incidence spectrum. For a predetermined angle of incidence, even a small variation in the layer thickness of the individual layers or in the overall thickness may lead to a not insignificant change in the reflectivity of the coating.

Further features and advantages of the invention emerge from the following description of exemplary embodiments of the invention, on the basis of the figures in the drawing which show details essential to the invention, and from the claims. The individual features can each be implemented individually, on their own, or several can be combined in any combination in a variant of the invention.

BRIEF DESCRIPTION OF THE DRAWINGS

Exemplary embodiments are depicted in the schematic drawing and will be explained in the following description. In detail.

DETAILED DESCRIPTION

Figure 1:
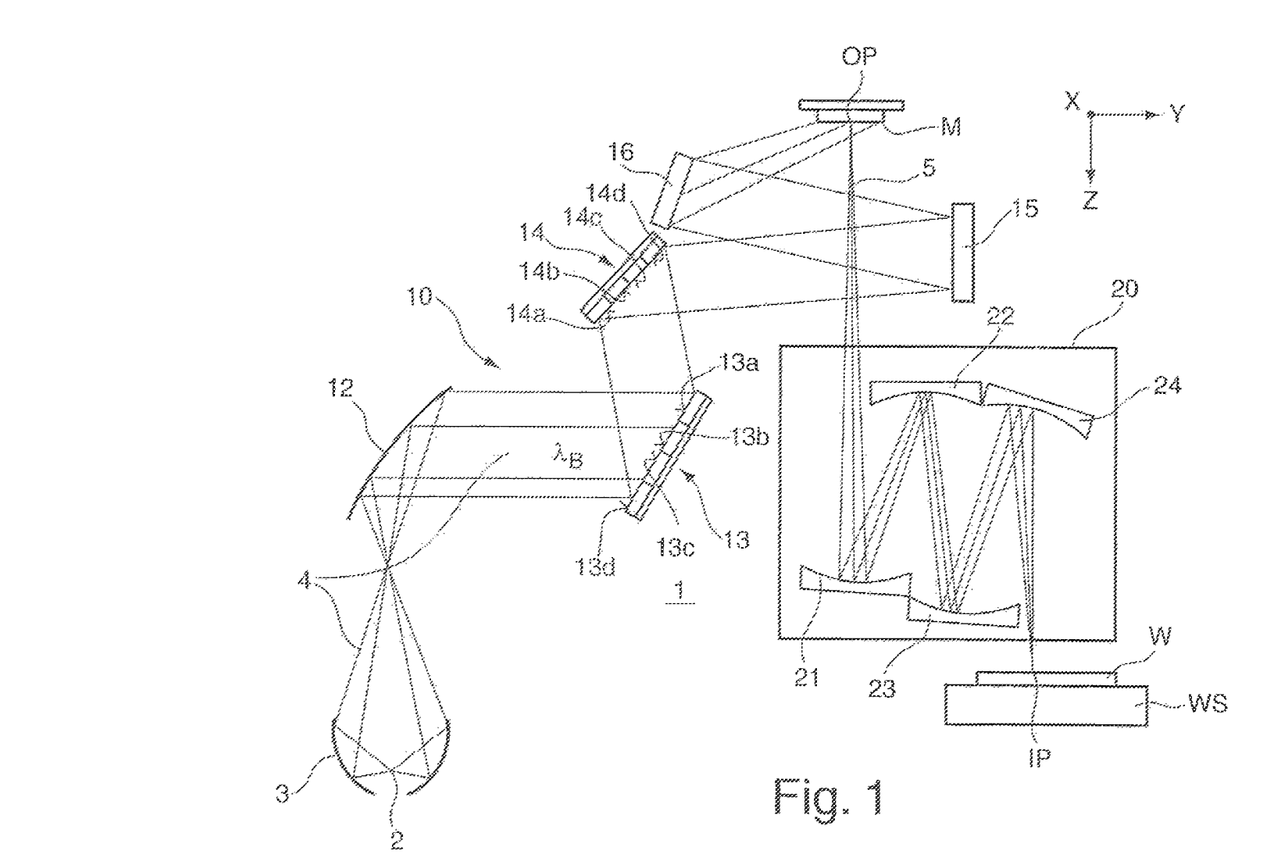
FIG. 1 shows a schematic illustration of an EUV lithography apparatus with an illumination system in which two facet mirrors are arranged.

FIG. 1 schematically shows an EUV lithography apparatus 1. It has an EUV light source 2 that generates EUV radiation, which has a high energy density in an EUV wavelength range below 50 nm, in particular between approximately 5 nm and approximately 15 nm. By way of example, the EUV light source 2 can be embodied in the form of a plasma light source that generates a laser-induced plasma, or as a synchrotron radiation source. In particular in the former case, it is possible, as shown in FIG. 1, to use a collector mirror 3 in order to focus the EUV radiation from the EUV light source 2 to form an illumination beam 4 and thus further increase the energy density. The illumination beam 4 has a wavelength spectrum which is concentrated in a narrow-band wavelength range about an operating wavelength $\lambda_B$, at which the EUV lithography apparatus 1 is operated. In order to select the operating wavelength $\lambda_B$ or in order to select the narrow-band wavelength range, use may optionally be made of a monochromator (not shown here).

The illumination beam 4 serves to illuminate a structured object M with an illumination system 10, which has five reflecting optical elements 12 to 16 in the present example. By way of example, the structured object M can be a reflective mask, which has reflecting and non-reflecting, or at least less strongly reflecting, regions for generating at least one structure on the object M. Alternatively, the structured object M can be a plurality of micromirrors, which are arranged in a one- or multi-dimensional arrangement and which can optionally be moved about at least one axis in order to set the angle of incidence of the EUV radiation 4 on the respective mirror.

The structured object M reflects part of the illumination beam 4 and forms a projection beam 5, which carries the information about the structure of the structured object M and which is radiated into a projection lens 20, which has four further optical mirror elements 21 to 24 in order to produce an image of the structured object M, or of a respective portion thereof, on a substrate W. The substrate W, for example a wafer, has a semiconductor material, e.g. silicon, and is arranged on a mount, which is also referred to as wafer stage WS.

In the present case, the second and the third reflecting element 13, 14 in the illumination system 10 are embodied as facet mirrors and have a plurality of facet elements in the form of micromirrors, which are arranged in a grid arrangement. In FIG. 1, four facet elements with the corresponding first and second optical surfaces 13a-d, 14a-d thereof are shown in an exemplary manner for each optical element 13, 14, at which surfaces the illumination beam 4 or a respective partial beam is reflected. The first optical element 13 is also denoted as a field raster element and serves for generating secondary light sources in the illumination system 10. The second optical element 14 is arranged at the position of the secondary light sources produced by the first optical element 13 and is also referred to as pupil raster element 14.

A partial beam of the illumination beam 4 incident on a respective optical surface 13a-d of the first optical element 13 is deflected on said optical surface onto an optical surface 14a-d of the second optical element 14. The optical surfaces 13a-d of the first optical element 13 may be rectangular and have an aspect ratio (x:y) of e.g. 20:1, wherein the X-direction extends perpendicular to the plane of the drawing of FIG. 1.

Each of the first optical surfaces 13a-d of the first optical element 13 can be tilted about an axis direction extending parallel to the X-direction in the present example. Additionally, a respective optical surface 13a-d may optionally also be tiltable about a further axis lying in the XZ-plane (plane of the drawing). This is how the direction in which the illumination beam 4 is incident on the optical surface 13a-d can be set. In particular, as a result of the tilt, it is also possible to modify the assignment between the optical surfaces 13a-d of the first optical element 13 and the optical surfaces 14a-d of the second optical element 14 in order to produce a desired illumination distribution (illumination pupil or angular distribution) at the position of the illuminated object M.

For selecting a respective illumination mode ("setting"), which corresponds to a desired illumination pupil, a different assignment between the optical surfaces 13a-d of the first optical element 13 and the optical surfaces 14a-d of the second optical element 14 may be selected, as is described, for example, in U.S. Pat. No. 6,658,084B2, by the applicant, to which reference is made in its entirety. Depending on which switch positions are selected for the optical surfaces 13a-d of the first optical element 13, the respective partial beams of the illumination beam 4 are directed to different optical surfaces 14a-d of the second optical element 14 in order to realize the respectively desired illumination setting, e.g. annular illumination or dipole illumination. In general, a 1:1 assignment between the optical surfaces 13a-d of the first optical element 13 and the optical surfaces 14a-d of the second optical element 14 is selected in a respective illumination mode or at a given time. However, an assignment can optionally also be brought about in such a way that two or more of the optical surfaces 13a-d of the first optical element 13 are assigned to a single optical surface 14a-d of the second optical element 14 in order to set different illumination modes. Details in this respect are found in U.S. 2009/0041182 A1, by the applicant, to which reference is made in its entirety.

Figure 2A:
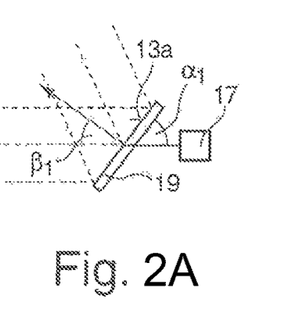
FIGS. 2A, 2B show schematic illustrations of a facet element in two different angular positions.
Figure 2B:
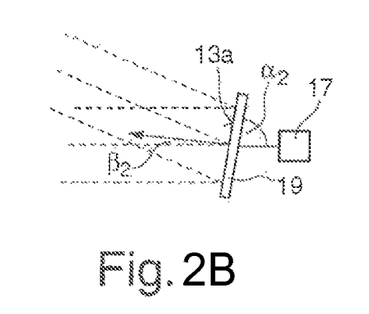

FIGS. 2A and 2B show, as a representative for all facet elements of the first optical element 13, an individual facet element 19 with an associated optical surface 13a and with an assigned actuator device 17, which serves for aligning the facet element 19 in the illumination beam path 4. The actuator device 17 can be embodied for tilting the facet element 19 or the optical surface 13a, but optionally it may also serve to rotate said facet element about an axis of rotation, as illustrated e.g. in DE 10 2009 054 888 A1, by the applicant, to which reference is made in its entirety. The actuator device 17 has a signaling connection to a central control device (not shown) via a signal line (not shown) in order to actuate the actuator devices 17 assigned to the respective optical surfaces 13a-d, 14a-d independently of one another. Here, several or all actuator devices 17 can be actuated at the same time or in succession in order to switch between different illumination settings.

In FIG. 2A, the facet element 19 of the first facet mirror 13 is shown in a first tilt angle position $\alpha_1 = 73°$, set by the actuator device 17, in which position the surface normal of the optical surface 13a is arranged at an angle of incidence $\beta_1 = 17°$ relative to the incident partial beam of the illumination beam 4. By contrast, in FIG. 2B, the facet element 19 is shown in a second tilt angle position $\alpha_2 = 77°$, in which the surface normal of the optical surface 13a is aligned at an angle of incidence $\beta_2 = 13°$ with respect to the incident partial beam of the illumination beam 4. It is understood that the optical surface 13a can also be operated in several further tilt angle positions through the actuator device 17, which tilt angle positions lie between the two angular positions $\alpha_1$, $\alpha_2$ shown in FIGS. 2A, 2B, which are measured in a plane perpendicular to a rotation or tilt axis of the facet element 19, which is aligned perpendicular to the plane of the drawing in FIGS. 2A, 2B and forms the central axis of the optical surface 13a in the present example. In the rest position, in which the actuator device 17 exerts no force on the facet element 19, the angle at which the facet element 19 is aligned may for example lie at $\alpha_0 = 90°$ (not shown in FIGS. 2A, 2B).

Since a partial beam of the illumination beam 4 incident on a respective optical surface 13a-d of the first optical element 13 is intended to be deflected onto an optical surface 14a-d of the second optical element 14 (and not in part between the optical surfaces 14a-d), only a few (discrete) angular positions $\alpha_1, \alpha_2, \ldots, \alpha_N$ of the first optical surfaces 13a-d are typically expedient and are set by the control unit during the operation of the illumination system 10. In FIGS. 2A, 2B, the direction of the incident illumination radiation 4 is identical in both angular positions $\alpha_1$, $\alpha_2$. However, it is understood that, in the case of the optical surfaces 14a-d of the second optical element 14 in a respective switch position, the direction of the incident illumination radiation 4, and hence of the angle of incidence, is dependent on the respective angular position $\alpha_1$, $\alpha_2$ of the optical surface 13a-d, assigned in a specific illumination mode to the respective optical surface 14a-d, of the first optical element 13, which naturally needs to be taken into account during the optimization.

Figure 3:
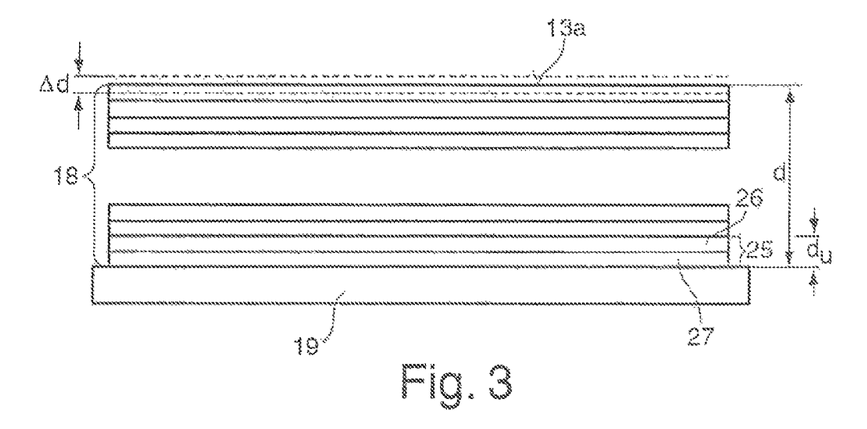
FIG. 3 shows a schematic illustration of a reflecting coating applied to the facet element from FIGS. 2A, 2B.

In order to reflect the illumination radiation 4 on a respective optical surface 13a-d, 14a-d of the optical elements 13, 14, a reflecting coating 18 is applied thereon, which is depicted in an exemplary manner in FIG. 3 for the facet element 19 of FIGS. 2A, 2B. The reflecting coating 18 is a multilayer coating and has a plurality of subunits 25, which each have two individual layers 26, 27, which consist of materials with different refractive indices. If EUV radiation with a wavelength $\lambda_B$ in the region of 13.5 nm is used, the individual layers 26, 27 usually consist of molybdenum and silicon. Depending on the operating wavelength $\lambda_B$, other material combinations, such as e.g. molybdenum and beryllium, ruthenium and beryllium or lanthanum and $B_4C$ are likewise possible.

In addition to the individual layers 26, 27, a reflective coating can also contain intermediate layers for preventing diffusion and a capping layer for preventing oxidation or corrosion; however, these are not shown in FIG. 3 and not taken into account in the optimization of the thickness d. The top side of the facet element 19 is referred to as optical surface 13a in the following text, even if, in a strict sense, the reflecting coating 18 as a whole brings about the reflection of the EUV radiation. The material of the facet element 19, on which the multilayer coating 18 is applied, may be a metallic material, e.g. ruthenium, but use can optionally also be made of a so-called zero-expansion material, e.g. ULE®, Zerodur®, etc.

The thicknesses of the individual layers of the coating 18 are in this case matched to the operating wavelength $\lambda_B$ of the illumination radiation (and the respective angle of incidence) in such a way that the coating 18 has the greatest possible reflectivity for the illumination radiation 4. For simplification purposes, the assumption is made below that the reflecting coating 18 has a number N of subunits 25 with in each case two individual layers 26, 27, i.e. $d=N*d_U$ applies, where $d_U$ denotes the thickness of the respective subunit 25 (i.e. the sum of the thicknesses of the individual layers 26, 27 with high and low refractive indices). The maximum reflectivity is typically obtained if the thickness $d_U$ of the subunits 25 satisfies the Bragg condition with respect to the angle of incidence and the employed wavelength $\lambda_B$ (or the employed wavelength spectrum). Here, the angle of incidence has an influence on the optical path length which the illumination radiation 4 traverses in the coating 18 or in the individual layers 26, 27 thereof such that the reflectivity is also dependent on the angle of incidence.

Figure 4A:
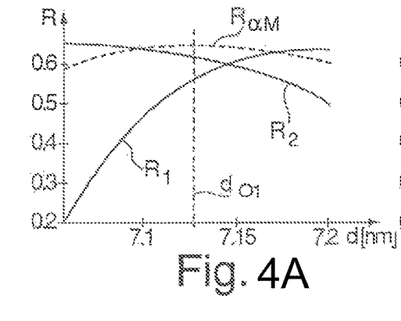
FIG. 4A shows a schematic illustration of thickness-dependent reflectivity curves for the two angular positions in FIGS. 2A, 2B, and for a further angular position.

FIG. 4A shows the dependence of the reflectivity R on the thickness d of the coating 18 for the first angular position $\alpha_1$ (first reflectivity curve $R_1$) and for the second angular position $\alpha_2$ (second reflectivity curve $R_2$) of FIGS. 2A, 2B. It can clearly be seen that the two reflectivity curves $R_1$, $R_2$, in the thickness range between approximately 7.05 nm and approximately 7.2 nm observed here, have an opposing dependence on the thickness d, i.e. the first reflectivity curve $R_1$ has a reflectivity maximum at the lower edge of the depicted thickness interval (at approximately 7.05 nm), while the second reflectivity curve $R_2$ has a reflectivity maximum at the upper edge of the depicted thickness interval (at approximately 7.2 nm). Therefore, the reflectivity R of the coating 18 cannot be maximized simultaneously for both angular positions $\alpha_1$, $\alpha_2$ at a given thickness d.

One option for setting a thickness for the coating 18, at which an acceptable reflectivity R is still achieved in both angular positions $\alpha_1$, $\alpha_2$, consists of initially determining the thickness-dependent reflectivity curve $R_{\alpha M}$ for the mean value of the two angles $\alpha_1$, $\alpha_2$, i.e. for $\alpha_M = \frac{1}{2}(\alpha_1+\alpha_2)=15°$ in the present case, and selecting that thickness $d_{O1}$ for the coating at which the reflectivity curve $R_{\alpha M}$ has a maximum. In the present example, this maximum lies at a thickness $d_{O1}$ of 7.1242 nm.

However, a problem arising in the case of such setting is that manufacturing-dependent thickness tolerances occur in a coating process for applying the reflecting coating 18 on the optical surface 13a, such that the actual thickness of the coating 18 generally deviates from the intended thickness $d_{O1}$ of 7.1242 nm. If the intended layer thickness $d_{O1}$ is not achieved exactly during the coating process, this may possibly lead to a significant reduction in the reflectivity R. For the example shown in FIG. 4A, the relative change in the reflectivity $\Delta R/R$ lies at 4% in the case of a relative thickness tolerance $\Delta d/d_{O1}$ of 0.1%, i.e. a comparatively small deviation in the thickness from the intended thickness $d_{O1}$ already leads to significant reduction in the reflectivity R.

As was illustrated further above, the reflectivity R of the coating 18 cannot be maximized simultaneously for both angular positions $\alpha_1$, $\alpha_2$. However, a thickness should be selected for the coating 18 at which deviations from the intended thickness or relative thickness tolerances, which are generated due to the manufacturing process when applying the coating 18, have the smallest possible influence on the reflectivity or on the relative change in the reflectivity.

Figure 4B:
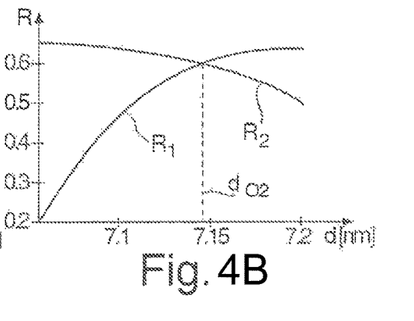
FIG. 4B shows an illustration analogous to FIG. 4A with two reflectivity curves for the two angular positions.

Such an option for selecting an optimized thickness is depicted in FIG. 4B. There, a thickness $d_{O2}$ for the coating 18 is selected, at which the reflectivities $R_1$, $R_2$ for the two angular positions $\alpha_1$, $\alpha_2$ have the same magnitude, wherein the thickness $d_{O2}$ lies at 7.1444 nm in the present case, at which thickness $R_1=R_2$ applies. The selection of the point of intersection of the reflectivity curves $R_1$, $R_2$ for setting the thickness already leads to a significant reduction in the sensitivity of the reflectivity in relation to the thickness tolerance. In the case of a relative thickness tolerance $\Delta d/d_{O2}$ of 0.1%, the relative change $\Delta R/R$ in the reflectivity only lies at approximately 2.12%.

In the following text, two further options for selecting the thickness of the coating 18 are described on the basis of FIG. 4C and FIG. 4D, by which the influence of manufacturing variations can be reduced further. In the criterion for setting the thickness of the coating 18 depicted in FIG. 4C, a mean value $R_M=\frac{1}{2}(R_1+R_2)$ is initially formed from the two reflectivity curves $R_1$, $R_2$, which is depicted by a dashed curve in FIG. 4C. This thickness-dependent mean value $R_M$ is optimized, i.e. that thickness $d_{OPT1}$ is determined at which the reflectivity curve $R_M$ has a maximum. In the present example, this is the case at $d_{OPT1}=7.1504$ nm. In the case of a predetermined thickness tolerance $\Delta d/d$ of 0.1%, the relative change in the reflectivity $\Delta R/R$ only lies at approximately 1.74% for this selection for the thickness of the coating.

Figure 4C:
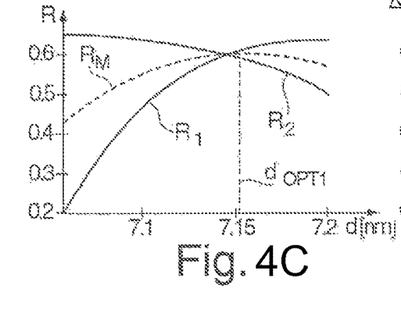
FIG. 4C shows an illustration analogous to FIG. 4B with a further reflectivity curve, which forms the mean value of the two reflectivity curves.
Figure 4D:
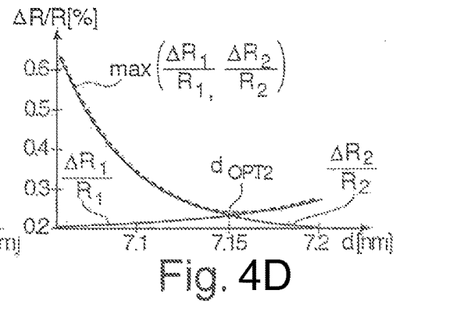
FIG. 4D shows an illustration of the relative change in the reflectivity depending on a predetermined manufacturing-dependent thickness tolerance.

In the criterion for setting the thickness of the coating 18 depicted in FIG. 4D, a relative thickness tolerance $\Delta d/d$ is initially predetermined for a given thickness d, which is 0.1% in the present example. Using the known reflectivity curves $R_1$, $R_2$, the relative change in the reflectivity $\Delta R_1/R_1$, $\Delta R_2/R_2$ associated with this thickness tolerance $\Delta d/d$ is determined at the two angular positions $\alpha_1$, $\alpha_2$. Subsequently, the minimum of that curve which constitutes the maximum in the change in the reflectivity $\Delta R_1/R_1$, $\Delta R_2/R_2$ at the two angular positions $\alpha_1$, $\alpha_2$ is sought after, i.e. that value is determined for the thickness $d_{OPT2}$ at which the value max $\Delta R_1/R_1$, $\Delta R_2/R_2$) is minimized. In the present example, $d_{OPT2}=7.1512$ nm results for the thickness determined according to this criterion. At this thickness, the relative change in the reflectivity $\Delta R/R$ only lies at 1.70% and is therefore even lower than in the case of the thickness $d_{OPT1}$ determined in accordance with FIG. 4c.

For setting the thickness $d_{OPT2}$ of the coating 18 as described in conjunction with FIG. 4D, it is necessary to know the (relative) manufacturing tolerances, or to determine these. The manufacturing tolerances depend, inter alia, on the type of the coating process employed for applying the coating 18 and on the employed coating parameters. If the manufacturing tolerances are unknown, it is possible to estimate these. It is understood that the deviation $\Delta d$ in the thickness d from the intended thickness is depicted in an exaggerated manner in FIG. 3 for clarification purposes. In general, the measured change in reflectivity is assigned to a deviation $\Delta d$, constant over the surface 13a, of the intended thickness d. However, it is understood that the optimization of the thickness of the coating 18 described here may optionally also take place in a position-dependent manner, i.e., for each point of the surface 13a, the respective angle of incidence spectrum incident there is taken into account, as a result of which a coating 18 typically emerges with a thickness varying over the surface 13a.

Both the method depicted in conjunction with FIG. 4C and the method depicted in conjunction with FIG. 4D can be generalized to more than two angular positions $\alpha_1$, $\alpha_2$, . . . $\alpha_N$ (N>2) in a manner that will be apparent to a person skilled in the art upon reviewing the present disclosure; however, this is not readily possible in the case of the method described in conjunction with FIG. 4B since no common point of intersection of the reflectivity curves is generally obtained in the case of more than two angular positions. In order to enable illumination that is as flexible as possible of the downstream optical system, it is advantageous if the difference between the individual tilt angles $\alpha_1, \alpha_2, \ldots$ is not too small. This is typically the case if the difference angle $|\alpha_a - \alpha_b|$ between two of the angular positions $\alpha_a, \alpha_b$ lies at at least 1°, preferably at at least 2°, in particular at at least 3°. However, the respective angles of incidence should not differ too much from one another in the different angular positions. The larger the angle of incidence is or the larger the difference between the angles of incidence on the respective optical surface 13a-d, 14a-d in the different angular positions $\alpha_1, \alpha_2, \ldots$ is, the more important the above-described optimization of the thickness d of the coating 18 becomes.

It should be understood that the respective reflectivity $R_1$, $R_2$ of the coating 18 at the two angular positions $\alpha_1, \alpha_2$ is dependent on the wavelength of the illumination radiation 4 which is incident on the optical surface 13a-d, 14a-d. In the simplest case, the reflectivity of the individual angular positions $\alpha_1, \alpha_2$ can be determined for the operating wavelength $\lambda_B$, at which the intensity of the illumination radiation is at a maximum. In order to improve the accuracy when setting the intended value for the thickness of the coating 18, an average can also be formed over the angles of incidence AOI, and also over the wavelength spectrum of the illumination radiation 4, i.e. the reflectivity emerges as $<<f(AOI) *g(\lambda)*R(d, AOI, \lambda)>_{AOI}>_\lambda$.

The weighting factor $g(\lambda)$ in the functional to be optimized in this case relates to the wavelength spectrum which arrives in the target area on the wafer W after the effect of all optical elements 12 to 16, M, 21 to 24 of the EUV lithography apparatus 1. Therefore, for the weighting $g(\lambda)$, the wavelength spectrum of the light source 2 and the spectral filtering of the illumination radiation 4, provided thereby, on all optical elements 12 to 16, M, 21 to 24 of the EUV lithography apparatus 1, which undertake spectral filtering, are taken into account.

The weighting over the angle of incidence spectrum f(AOI) can take place to take account of the fact that, in the case of a predetermined tilt angle, the angle of incidence spectrum is not discrete. It is understood that, under the assumption of a single (discrete) angle of incidence at a given angular position $\alpha_1, \alpha_2$, the functional when averaging over the angles of incidence AOI corresponds to a sum of the reflectivities at the respective tilt angle positions $\alpha_1, \alpha_2$, wherein a different weighting factor is optionally to be taken into account for each angular position $\alpha_1, \alpha_2$.

The weighting function f(AOI) typically differs for the respective optical surfaces 13a-d, 14a-d and, both in the discrete and in the continuous case, can take into account the fact that an angle of incidence or angle of incidence range which is assigned to a first tilt angle $\alpha_1$ is employed less frequently during the operation of the illumination system 10 than an angle of incidence or angle of incidence range which is assigned to a second tilt angle $\alpha_2$. The weighting function f(AOI) can also take account of the fact that a change in the reflectivity of the coating 18 has a differently pronounced effect on errors in the exposure process of the EUV lithography apparatus 1, depending on the angle of incidence (and the respective optical surface 13a-d, 14a-d).

Since the angular positions or the angles of incidence of the illumination radiation 4 generally depend on the position of the respective optical surface 13a-d, 14a-d in the illumination beam path, a coating 18 with an individually optimized thickness $d_{OPT1}, d_{OPT2}, d_{O2}$ can be applied to the respective optical surfaces 13a-d, 14a-d of the individual facet elements 19 during the production of a respective optical element 13, 14. If the individual angular positions are the same for a plurality of facet elements 19, or optionally for all of these, a coating 18 with an identical thickness $d_{OPT1}, d_{OPT2}, d_{O2}$ can be applied to the associated optical surfaces 13a-d, 14a-d. In this case, the coating process can occur in parallel or at the same time for the corresponding number of facet elements 19.

It is understood that, unlike as depicted further above, it is not mandatory for a coating 18 with a homogeneous thickness $d_{OPT1}, d_{OPT2}, d_{O2}$ over the optical surface 13a-d, 14a-d to be applied, but there may optionally also be a position-dependent optimization of the thickness of the coating 18 at a respective optical surface 13a-d, 14a-d. Such a position-dependent optimization takes account of the fact that the angle of incidence spectrum at a respective optical surface 13a-d, 14a-d may vary depending on position.

Although the layer thickness optimization was described in the context of an EUV lithography apparatus, it is understood that the above-described criteria can also be employed in an advantageous manner in illumination systems in other optical apparatuses, for example in illumination systems for UV lithography, provided that these are equipped with reflecting optical elements which are operated in several different (in particular discrete) angular positions. Also, only tilt angle positions $\alpha_1, \alpha_2$ with respect to a single tilt axis were taken into account in the illustration above. However, it is understood that, in the case where the optical surfaces 13a-d, 14a-d can also be tilted by a further tilt axis, which is e.g. perpendicular to the first tilt axis, by an appropriate actuator unit 17, the corresponding angular positions about the further tilt axis can likewise be taken into account when optimizing the thickness.

What is claimed is:

1. Illumination system for an optical arrangement, comprising:
   at least one optical element, which has at least one optical surface on which a reflecting coating which reflects the illumination radiation from a light source is applied, and
   an actuator device for aligning the at least one optical surface in at least two angular positions ($\alpha_1, \alpha_2$), a magnitude of an angle of incidence ($\beta_1, \beta_2$) of the incident illumination radiation in the at least two angular positions ($\alpha_1, \alpha_2$) being different, wherein either:
   the reflecting coating has a thickness ($d_{OPT1}$) at which a mean value ($\frac{1}{2}(R_1+R_2)$) formed from a thickness-dependent reflectivity ($R_1, R_2$) of the coating at the at least two angular positions ($\alpha_1, \alpha_2$) is maximized or
   the reflecting coating has a thickness ($d_{OPT2}$) at which a maximum change ($\max(\Delta R_1/R_1, \Delta R_2/R_2)$) in the reflectivity ($R_1, R_2$) caused by a thickness tolerance ($\Delta d/d$) of the coating is minimized at the respective angular positions ($\alpha_1, \alpha_2$).

2. The illumination system according to claim 1, wherein the mean value formed from the thickness-dependent reflectivity ($R_1, R_2$) is a mean value weighted over the at least two angular positions ($\alpha_1, \alpha_2$), with the weighting of the angular positions ($\alpha_1, \alpha_2$) being dependent on the position of the optical surface on the optical element.

3. The illumination system according to claim 1, wherein a difference angle ($|\alpha_1-\alpha_2|$) between respectively two of the angular positions ($\alpha_1, \alpha_2$) is at least 1°.

4. The illumination system according to claim 1, wherein the thickness ($d_{OPT1}$, $d_{OPT2}$) of the reflecting coating varies depending on the position on the optical surface.

5. The illumination system according to claim 1, further comprising: a light source that generates illumination radiation having a wavelength spectrum that has a maximum intensity at an operating wavelength of the illumination system.

6. Optical arrangement comprising: an illumination system according to claim 5.

7. The optical arrangement according to claim 6, wherein the thickness-dependent reflectivity ($R_1$, $R_2$) of the coating of the optical element at the at least two angular positions ($\alpha_1$, $\alpha_2$) is averaged over the wavelength spectrum which is generated by the light source and which is filtered by further optical elements of the optical arrangement.

8. The optical arrangement according to claim 6, wherein the arrangement is an extreme-ultraviolet lithography apparatus for exposing a substrate.

9. The illumination system according to claim 1, wherein the optical element is embodied as a facet mirror and the optical surfaces are formed on facet elements of the facet mirror.

10. The illumination system according to claim 1, wherein the optical arrangement is an extreme-ultraviolet lithography apparatus.

11. The illumination system according to claim 1, wherein the optical element has a plurality of optical surfaces.

12. The illumination system according to claim 1, wherein R1 differs from R2.

13. Method for optimizing a thickness ($d_{OPT1}$, $d_{OPT2}$) of a reflecting coating of an optical surface of an optical element for an illumination system of an optical arrangement, comprising:
  determining a thickness-dependent reflectivity ($R_1$, $R_2$) of the reflecting coating in at least two angular positions ($\alpha_1$, $\alpha_2$), a magnitude of an angle of incidence ($\beta_2$, $\beta_2$) of the incident illumination radiation in the at least two angular positions ($\alpha_1$, $\alpha_2$) being different, in which the optical surface can be aligned in the illumination beam path of a light source and either:
  determining a thickness ($d_{OPT1}$) for the reflecting coating at which a mean value ($\frac{1}{2}(R_1+R_2)$) formed from the thickness-dependent reflectivity ($R_1$, $R_2$) at the at least two angular positions ($\alpha_1$, $\alpha_2$) is maximized or
  determining a thickness ($d_{OPT2}$) for the reflecting coating at which a maximum change ($\max(\Delta R_1/R_1, \Delta R_2/R_2)$) in the thickness-dependent reflectivity ($R_1$, $R_2$) caused by a thickness tolerance ($\Delta d/d$) stemming from a manufacturing process of the coating is minimized at the respective angular positions ($\alpha_1$, $\alpha_2$).

14. The method according to claim 13, wherein a weighting over the at least two angular positions ($\alpha_1$, $\alpha_2$) is made for forming the mean value, with the weighting of the angular positions ($\alpha_1$, $\alpha_2$) being dependent on the position of the optical surface on the optical element.

15. The method according to claim 13, wherein a difference angle ($|\alpha_1-\alpha_2|$) between two respective angular positions ($\alpha_1$, $\alpha_2$) is at least 1°.

16. The method according to claim 13, wherein the thickness ($d_{OPT1}$, $d_{OPT2}$) of the reflecting coating is determined depending on the position on the optical surface.

17. The method according to claim 13, wherein the thickness-dependent reflectivity ($R_1$, $R_2$) of the coating at the at least two angular positions ($\alpha_1$, $\alpha_2$) is averaged over the wavelength spectrum which is generated by a light source and which is filtered by further optical elements of the optical arrangement.

18. Method for generating a reflecting coating on an optical surface of an optical element for an illumination system, comprising: applying the coating on the optical surface with a thickness ($d_{OPT1}$, $d_{OPT2}$) determined in accordance with the method according to claim 13.

19. The method according to claim 13, wherein R1 differs from R2.

* * * * *

UNITED STATES PATENT AND TRADEMARK OFFICE
CERTIFICATE OF CORRECTION

Page 1 of 1

PATENT NO. : 10,146,136 B2
APPLICATION NO. : 14/839404
DATED : December 4, 2018
INVENTOR(S) : Martin Endres et al.

It is certified that error appears in the above-identified patent and that said Letters Patent is hereby corrected as shown below:

In the Specification

Column 12, Line 36; Delete "max $\Delta R_1/R_1$, $\Delta R_2/R_2$)" and insert -- max($\Delta R_1/R_1$, $\Delta R_2/R_2$) --, therefor.

Signed and Sealed this
Fourth Day of August, 2020

Andrei Iancu
*Director of the United States Patent and Trademark Office*